United States Patent [19]

Hanji

[11] 4,173,726
[45] Nov. 6, 1979

[54] TUNING FORK-TYPE PIEZOELECTRIC VIBRATOR

[75] Inventor: Motoyasu Hanji, Tokyo, Japan

[73] Assignee: Kabushiki Kaisha Kinekisha-Kenkyujo, Tokyo, Japan

[21] Appl. No.: 703,497

[22] Filed: Jul. 8, 1976

Related U.S. Application Data

[63] Continuation of Ser. No. 592,955, Jul. 3, 1975, abandoned.

[30] Foreign Application Priority Data

Jul. 5, 1974 [JP] Japan ............................. 49-78680[U]

[51] Int. Cl.² ........................................... H01L 41/10
[52] U.S. Cl. .................................... 310/366; 310/370
[58] Field of Search .................. 310/8.2, 9.5, 9.6, 9.7, 310/9.8, 370; 58/23 TF; 84/409, 457

[56] References Cited

U.S. PATENT DOCUMENTS

| 3,128,397 | 4/1964 | Shinada et al. | 310/9.5 |
| 3,683,213 | 8/1972 | Staudte | 310/9.6 |
| 3,697,766 | 10/1972 | Ganter et al. | 310/9.8 X |
| 3,946,257 | 3/1976 | Kawamura | 310/270 |

Primary Examiner—Mark O. Budd
Attorney, Agent, or Firm—William Anthony Drucker

[57] ABSTRACT

A tuning fork-type piezoelectric vibrator having electrodes for the excitation formed on the legs of the vibrator body which electrodes extend for at most subsequently half the length of said leg reveals a powerful suppression of the vibration modes of higher orders and substantially no increase in the series resonant impedance in the vibration modes of fundamental frequency.

5 Claims, 25 Drawing Figures

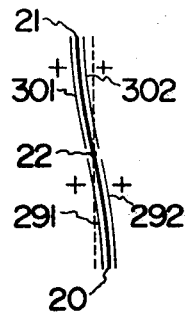
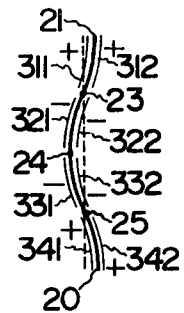
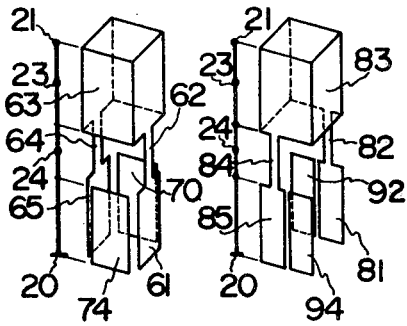
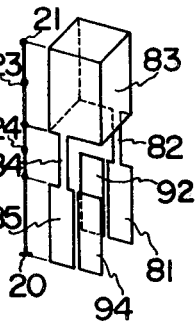
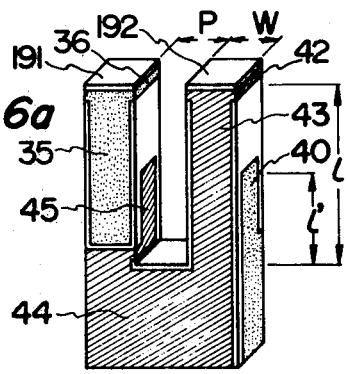
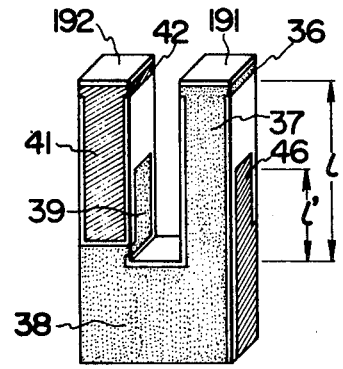
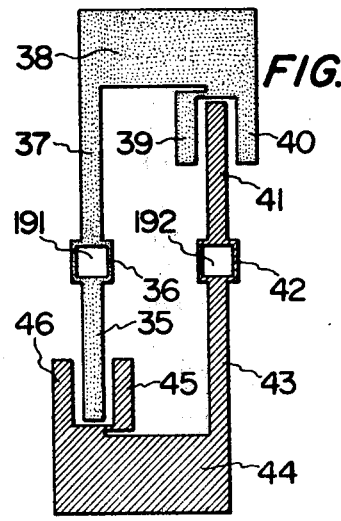
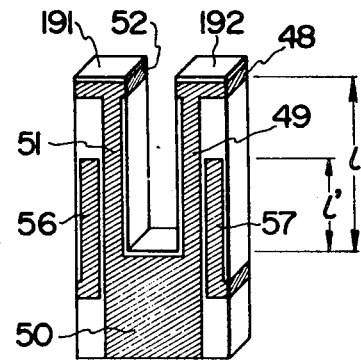

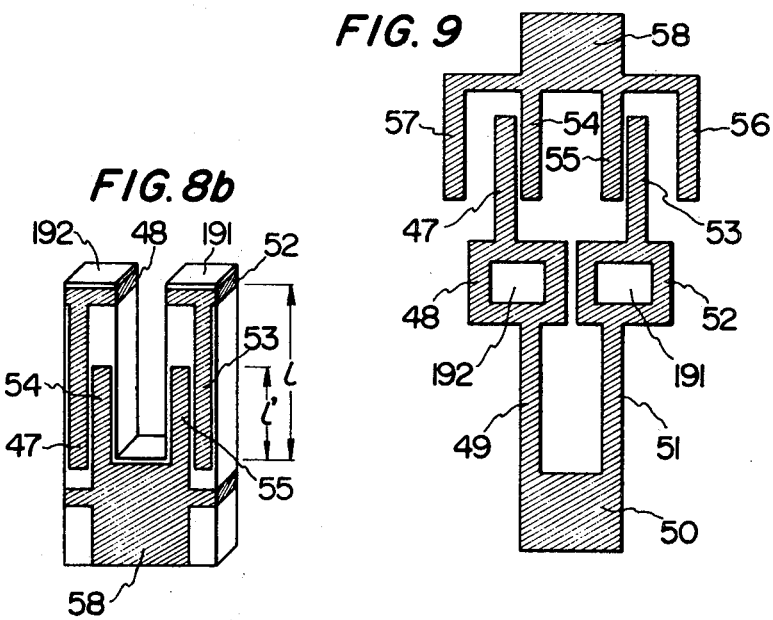
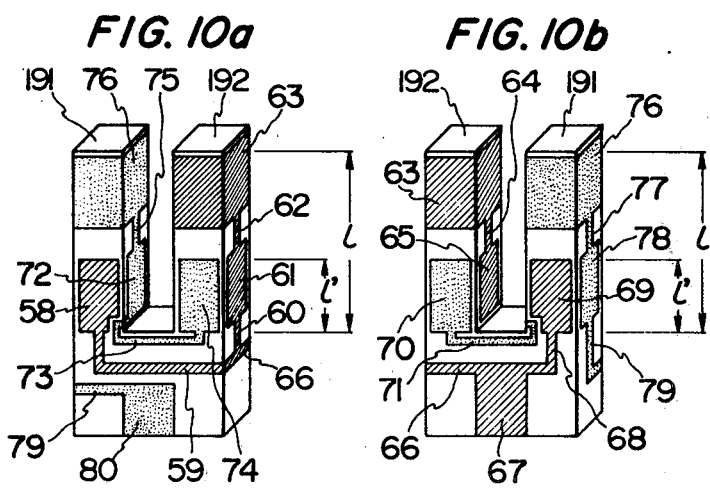

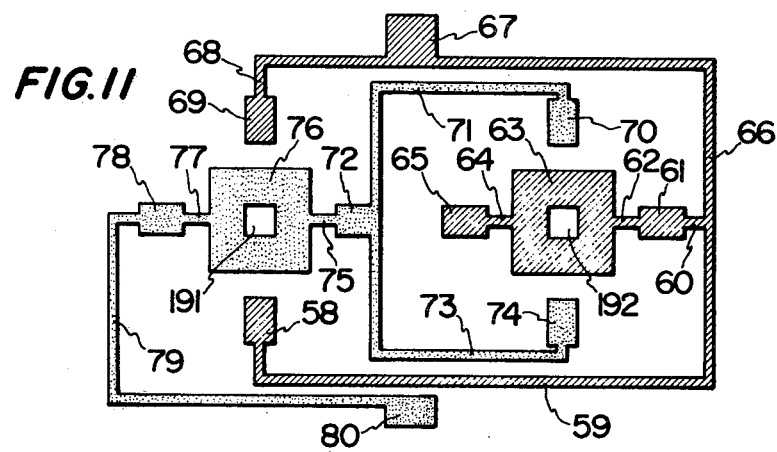
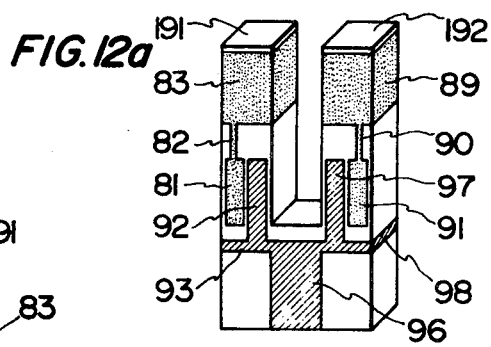
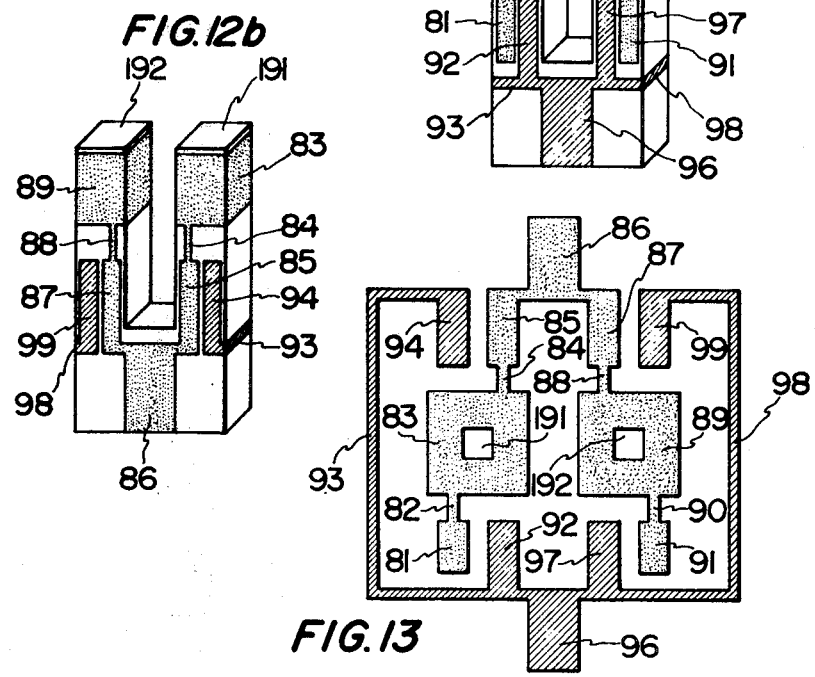

TUNING FORK-TYPE PIEZOELECTRIC VIBRATOR

This is a continuation of application Ser. No. 592,955, filed July 3, 1975, now abandoned.

BACKGROUND OF THE INVENTION

This invention relates to tuning fork-type piezoelectric vibrators operated with suppressed vibration modes of higher orders which are undesirable in operation of such piezoelectric vibrators.

In a tuning fork-type piezoelectric vibrators of piezoelectric material such as single crystal piezoelectric body of quartz, lithium tantalate, lithium niobate or polycrystalline piezoelectric ceramics, various electrode arrangements have heretofore tried so that said piezoelectric vibrators may have desired flexural vibration modes according to the cutting angles of the crystals used.

In FIGS. 1a and 1b which are shown respectively in a tuning fork-type piezoelectric vibrator body, hatched portions indicate electrodes for effecting flexural vibration in the tuning fork-type piezoelectric vibrator bodies. It is seen particularly from FIG. 2a that split electrodes 3, 4, 5, 6, 7, 8, 9 and 10 are provided on the faces of legs 111 and 112 extending from base portion 201 of the vibrator body. Said faces of the legs are contained respectively in the principal planes or planes $B_1C_1$ shown in FIG. 1a. And, it is seen particularly, from FIG. 2b that so-called four side electrodes 10, 11, 12, 13, 14, 15, 16, and 17 are provided on the faces of legs 121 and 122 extending from base portion 202 of the vibrator body. Said faces of the legs are contained in the principal plane $B_2C_2$ or the side plane $A_2C_2$. As apparent from FIGS. 1a and 1b, a tuning fork-type piezoelectric vibrator is formed in a U-shape having principal faces contained in plane $B_1C_1$ or plane $B_2C_2$.

The crystal axes $A_1$, $B_1$, $C_1$ and $A_2$, $B_2$, $C_2$ are respectively cubic rectangular coordinate axes. And, the direction of cutting of a tuning fork-type piezoelectric vibrator using coordinate axes commonly used of crystal is expressed as follows: For quartz crystals, $A_1$ is X, $B_1$ is Z' and $C_1$ is Y'; and $A_2$ is Z', $B_2$ is X and $C_2$ is Y'. For lithium tantalate crystals, $A_1$ is Z', $B_1$ is X' and $C_1$ is Y''; and $A_2$ is X'', $B_2$ is Z' and $C_2$ is Y'''. And, for lithium niobate crystals, because it has no zero-temperature coefficient, the directions of cutting with respect to FIG. 1a and FIG. 1b can be expressed such that $A_1$ is an axis other than the X-axis and $C_1$ is an axis other than the Z-axis, and $B_2$ is an axis other than the X-axis and $C_2$ is an axis other than the Z-axis respectively.

Hereon, the coordinate XY'Z' indicate a coordinate which is the original coordinate XYZ pivoted around the X-axis. The coordinate X'Y''Z' indicates a coordinate which is the original coordinate XYZ pivoted around the Z-axis, to cause the coordinate X'Y'Z and subsequently pivoted around the X'-axis.

To pivot a coordinate such as stated above is to pivot the direction of cutting of a piezoelectric body at a desired angle so as to obtain a frequency characteristic suitable for the temperatures to be used. This is normal means in a design of piezoelectric flexural vibrators. And, for a polycrystalline piezoelectric ceramic body, the plane of flexure is to be polarized since it does not have the axes of crystal such as in a piezoelectric body of single crystal.

Referring now to FIGS. 2a and 2b, tuning fork-type piezoelectric vibrators such as shown in FIGS. 1a and 1b will vibrate respectively in the $B_1C_1$-plane and the $B_2C_2$-plane for the flexural vibration upon impression or between terminals $D_1$ and $E_1$ and terminals $D_2$ and $E_2$, of an alternating voltage corresponding to the resonant frequencies of said tuning fork-type piezoelectric vibrators. A tuning fork-type vibrator as shown in FIGS. 1a and 1b can be secured firmly by supporting the same at the principal faces or the side faces of the base portion 201 or the base portion 202 of the respective vibrator body.

Now, upon supporting the vibrator body at any portion of said body, a tuning fork-type piezoelectric vibrator produces usually vibration modes of higher orders other than the desired vibration mode of fundamental frequency. Moreover, particularly in such a small-sized tuning fork-type vibrator for being incorporated in a wrist watch, vibration modes of higher orders are produced easily due to the structure of electrodes provided on the faces of such a vibrator body. In such a vibrator body, the electrodes as indicated at hatched portions in FIGS. 1a and 1b are formed as large as possible so as to prevent the series resonant impedance of the vibrator from being increased. Such a structure of the electrodes in a relatively small tuning fork-type vibrator causes the series resonant impedance for the vibration modes of higher orders to be smaller than that for the vibration mode of fundamental frequency.

SUMMARY OF THE INVENTION

It is an object of this invention to provide tuning fork-type piezoelectric vibrators operated substantially exclusively under the vibration modes of fundamental frequencies.

It is another object of this invention to provide means for effecting suppression of the vibration moes of higher orders of tuning fork-type piezoelectric vibrators upon operation under the vibration modes of fundamental frequencies proper to said tuning fork-type piezoelectric vibrators.

It is still another object of this invention to provide electrode arrangements to be provided on the faces of tuning fork-type piezoelectric vibrators for effecting vibration of said vibrator bodies upon impression of a predetermined alternating boltage on said electrodes which arrangements of electrodes has an ability of effecting suppression of unwanted vibration modes of higher orders.

It is still another and important object of this invention to provide electrode arrangements for tuning fork-type piezoelectric vibrators which can effect considerable suppression of the vibration modes of higher orders without effecting substantial increase in the series resonant impedance for the vibration mode of fundamental frequency.

Further objects and merits of this invention will become apparent from the following description taken in connection with the accompanying drawings.

BRIEF DESCRIPTION OF THE DRAWINGS

FIG. 2a is an electric connection diagram corresponding to a vibrator shown in FIG. 1a.

FIG. 4a is a schematic graphical view corresponding to FIG. 3b for illustrating distribution of electric charges on the side faces of said leg.

FIG. 4b is a schematic graphical view corresponding to FIG. 3c for illustrating distribution of electric charges on the side faces of said leg.

FIG. 5a is a schematic oblique view of a first-type electrode arrangement adapted to be formed on the leg as having four side electrodes for the excitation of a tuning fork-type piezoelectric vibrator according to this invention.

FIG. 5b is a schematic oblique view of another first-type electrode arrangement adapted to be formed on the leg as having split electrodes for the excitation of a tuning fork-type piezoelectric vibrator according to this invention.

FIG. 6a is a front oblique view of the third embodiment of this invention.

FIG. 6b is a rear oblique view of the third embodiment of this invention.

FIG. 7 is a developed view of the electrode arrangement of the third embodiment of this invention.

FIG. 8a is a front oblique view of the fourth embodiment of this invention.

FIG. 8b is a rear oblique view of the fourth embodiment of this invention.

FIG. 9 is a developed view of the electrode arrangement of the fourth embodiment of this invention.

FIG. 10a is a front oblique view of the first embodiment of this invention.

FIG. 10b is a rear oblique view of the first embodiment of this invention.

FIG. 11 is a developed view of the electrode arrangement of the first embodiment of this invention.

FIG. 12a is a front oblique view of the second embodiment of this invention.

FIG. 12b is a rear oblique view of the second embodiment of this invention.

FIG. 13 is a developed view of the electrode arrangement of the second embodiment of this invention.

DETAILED DESCRIPTION OF THE INVENTION

Figures 3A, 3B, 3C, 3D:
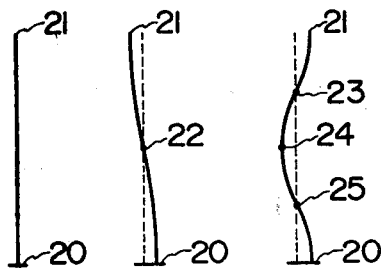
FIG. 3a is a leg shown graphically of a tuning fork-typ piezoelectric vibrator in the unexcited position.
FIG. 3b is the leg as shown in FIG. 3a vibrated under the vibration mode of fundamental frequency.
FIG. 3c is the leg as shown in FIG. 3a vibrated under the vibration mode of second order.
FIG. 3d is the leg as shown in FIG. 3a vibrated under the vibration mode of third order.
Figure 3E:
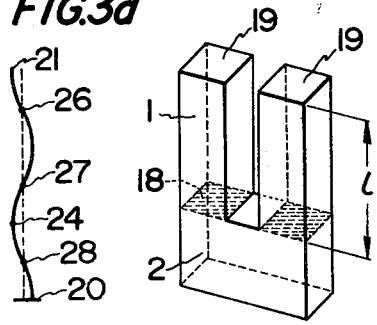
FIG. 3e is a schematic oblique view of a tuning fork-type piezoelectric vibrator body for illustrating vibration modes of the leg.

Referring now to FIGS. 3a, 3b, 3c, 3d and 3e, imaginary boundary faces 18 located between base portion 2 and legs 1 of a tuning fork-type vibrator body are not fixed immobile but are to slide in operation of said vibrator body. Suppose a said leg 1 has been separated from said base portion 2 and drawn in its unexcited position as shown in FIG. 3a, it will be vibrated under the vibration mode of fundamental frequency such as shown in FIG. 3b. It will be vibrated under the vibration mode of second order such as shown in FIG. 3c. And, under the vibration mode of third order, it will be vibrated such as shown in FIG. 3d. The top end indicated at 21 of a leg is called herein the "free end" because it can be moved freely. And, the bottom end indicated at 20 of said leg is called herein the "sliding end" because it is located along said boundary face 18 which is to slide under the vibration of said leg. Numerals 22, 23, 25, 26, 27 and 28 indicate respectively a nodal point of vibration. And, numeral 24 indicates a point at which direction of flexure of the leg is reversed.

Now, when an outer stress is acted on a piezoelectric body, electric charges are produced on the faces of said body. And, on the contrary, when electric charges are given on the faces of said piezoelectric body, a stress is caused in said body which causes strain of said body. For example, a tuning fork-type quartz vibrator is vibrated at flexural vibration caused by expansion and contraction actions in the direction of Y'-axis of the quartz crystal which expansion and contraction are caused by said strain in said vibrator body.

In considering modes of vibration of a leg of a tuning fork-type vibrator body by reference to FIGS. 4a and 4b which correspond respectively to FIGS. 3b an 3c, positive and negative charges will appear respectively on the contracted and expanded portions on the sides of the leg such as shown in FIGS. 4a and 4b. Such portions bearing positive charges are indicated at 301, 291, 292, 311, 312, 341 and 342. And such portions bearing negative charges are indicated at 321, 322, 331 and 332. The portions of the leg located between the points 23 and 25 which indicate the nodal points of vibration bear charges which will induce the vibration mode of second order.

And, it will be understood that, firstly, if the electric charges appearing on the portion between points 23 and 25 are cancelled by the electric charges appearing on the portion between points 21 and 23, or secondly, if the portion between 23 and 25 is not supplied with electric charges by not providing electrodes thereon, the vibration mode of second order will not be produced.

According to the above-noted first means for preventing the leg from being vibrated at the vibration mode of second order, a common electrode corresponding to the portions 311 and 321 is provided on one side of the leg and another common electrode corresponding to the portions 312 and 322 is provided on another side of the leg. The amount of charges produced on the portion 311 is to be made equal to the amount of the charges produced on the portion 321. Also, the amounts of the charges produced on the portion 312 is to be made equal to the amount of the charges produced on the portion 322. And, the electrodes for the excitation is provided along the portion between the points 20 and 24 which are respectively said sliding end and the inflection point of the leg. Said point 24 is located at almost half the length l of the leg extending from said sliding end 20. Even if the electrodes for the excitation have portions extending to the portions 331 and 332, the total amount of electric charges on the portions 331 and 332 which otherwise is to excite the vibration mode of second order is cancelled by means of said common electrodes so that the vibration mode of second order is not caused thereby. Such an electrode arrangement having electrodes for cancelling unwanted electric charges to be produced on the leg of the vibrator body will hereinafter be called "first-type electrode arrangement".

Examples of said first-type electrode arrangement to be provided on a leg of a tuning fork-type vibrator body according to the above-description are shown in FIGS. 5a and 5b. The electrodes respectively shown in FIGS. 5a and 5b can be adapted to form on the vibrator bodies respectively shown in FIGS. 1a and 1b. And, in the figures, numerals 61, 65, 70, 74, 85, 94, 81 and 92 indicate the electrodes for the excitation, numerals 62, 64, 82 and 84 the electrodes for the connection, numerals 63 and 83 the common electrodes for the cancellation of unwanted electric charges.

And, according to the foregoing second means for preventing the leg from being vibrated under the vibration mode of second order, no electrode arrangement for the excitation is provided at location between the points 23 and 25. The electrodes which correspond to said portions 311 and 312 can be eliminated and the electrodes for the excitation provided on the portions 341 and 342 are sufficient for the vibration under the vibration mode of the fundamental frequency. Such an electrode arrangement having no electrode for the excitation on the side faces of the leg between said points 23 and 25 will hereinafter be called "second-type electrode arrangement".

Figure 1A:
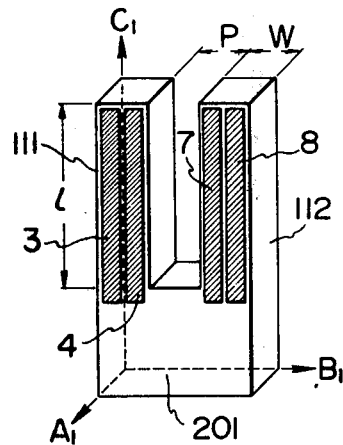
FIG. 1a is a schematic oblique view of a conventional tuning fork-type piezoelectric vibrator provided thereon with split electrodes.
Figure 1B:
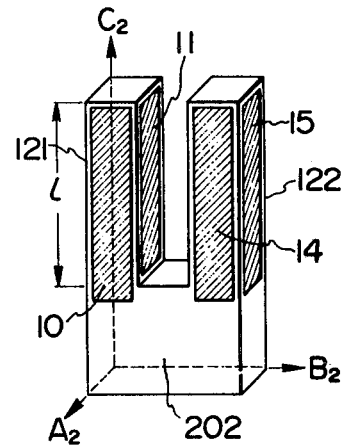
FIG. 1b is a schematic view of another conventional tuning fork-type piezoelectric vibrator provided thereon with four side electrodes.
Figure 2A:
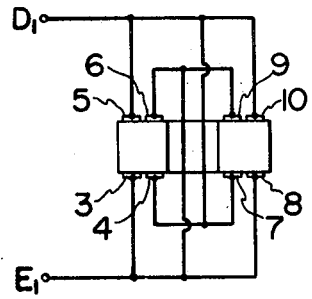
Figure 2B:
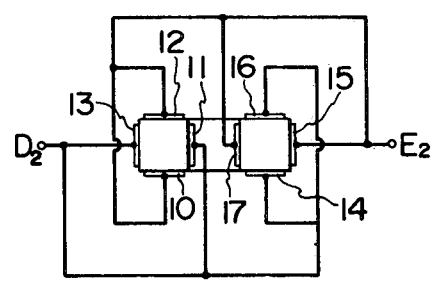
FIG. 2b is an electric connection diagram corresponding to a vibrator shown in FIG. 1b.

However, from th view point of the series resonant impedance of the vibrator, the value of which is desired to be as small as possible, to provide the electrode for the excitation on the portions 341 and 342 which are limited between the points 20 and 25 will have a drawback because its value is larger than that given by a conventional electrode arrangement for the excitation such as shown in FIG. 1a or FIG. 1b. Hereupon the electrodes for the excitation were extended to said point 24 located substantially at the center of he length of the leg. And, according to my experiments, it has been found that the series resonant impedance regarding the fundamental frequency is substantially equal to that of a conventional tuning fork-type vibrator such as shown in FIG. 1a or FIG. 1b.

And now, it will be understood in such an arrangement of electrodes as stated above, that common electrodes 63 and 83 for the cancellation of the unwanted electric charges are unnecessary to be provided.

As will be noted in the following experimental data, a tuning fork-type piezoelectric vibrator according to this invention reveals an excellent property for the suppression of vibration modes of higher orders, particularly of second order. And, according to this invention, degradation of the property regarding the series resonant impedance of the vibrator does not occur. My experimental data will be noted as follows: A tuning fork-type quartz vibrator such as shown in FIGS. 1a and 1b having a size, $l=3.8$ mm, $W=0.65$ mm and $P=0.25$ mm in which l and W are respectively the length and the width of the leg, and P is the distance between the legs, and having four side electrodes such as shown in FIG. 1b was vibrated in an oscillation circuit of 32 kHz. And, values of the series resonant impedance of this vibrator with respect to the fundamental frequency and the second and third harmonics were measured. The values obtained were 15 kilohms, 8 kilohms and 15 kilohms with respect to the vibration modes of fundamental frequency, second order, and third order respectively. Such values of the series resonant impedance of a tuning fork-type quartz vibrator such as shown in FIG. 1a having the above-noted size were substantially equal to the above.

Subsequently, another tuning fork-type quartz vibrator having a size equal to the above but having an electrode arrangement such as shown in FIG. 5a was measured under the same condition as noted above. The values of the series resonant impedance obtained were 16 kilohms, over 1000 kilohms, and 50 kilohms with respect to the vibration modes of fundamental frequency, second order and third order respectively. And, the values of the series resonant impedance measured of a tuning fork-type quartz vibrator such as stated above but having electrode arrangement as shown in FIG. 5b were subsequently equal to those as noted above.

In FIGS. 6a to 12b are shown some preferred embodiments of this invention. The first embodiment of this invention shown in FIGS. 10a and 10b has the foregoing first-type four side electrode arrangement as shown in FIG. 5a formed on the legs of a vibrator body. The electrode arrangement includes electrodes 58, 69, 72, 78, 61, 65, 70 and 74 for the excitation, common electrodes 63 and 76 for the cancellation of unwanted electric charges, and electrodes 75, 77, 62 and 64 for connecting said electrodes for the excitation and said common electrodes. Electrodes 67 and 80 are the electrodes formed on the base portion of the vibrator body for connecting the same to an oscillation circuit for the excitation of the vibrator.

The second embodiment of this invention as shown in FIGS. 12a and 12b has the foregoing first-type split electrode arrangement as shown in FIG. 5b formed on the legs of a vibrator body. The electrode arrangement includes electrodes 81, 85, 92, 94, 87, 91, 97 and 99 for the excitation, the above-mentioned common electrodes 83 and 89, and electrodes 82, 84, 88 and 90 for the connection of said electrodes for the excitation and said common electrodes. Electrodes 86 and 96 are he electrodes formed on the base portion of the vibrator body for connecting the same to an oscillation circuit for the excitation of the vibrator.

The third embodiment of this invention as shown in FIGS. 6a and 6b has the foregoing second-type four side electrode arrangement which is not shown in the drawings but is formed on the legs of a vibrator body. The electrode arrangement includes electrodes 35, 37, 45, 46, 39, 40, 41 and 43 for the excitation. As shown in the figures there is provided no electrodes on the side faces of the legs except for said electrodes 45, 46, 39 and 40 extending from said sliding end indicated at 18 in FIG. 3e for about a half length indicated at l' of the length l of the leg. Electrodes 38 and 44 are the electrodes formed on the base portion of the vibrator body for connecting the same to an oscillation circuit for the operation of the vibrator.

The fourth embodiment of this invention as shown in FIGS. 8a and 8b has the foregoing second-type split electrode arrangement formed on the principal faces of the vibrator body. The electrode arrangement includes electrodes 47, 49, 54, 57, 51, 53, 55 and 56 for the excitation. There is provided no electrodes on the side faces of the legs. Electrodes 50 and 58 are the electrodes for connecting to the oscillation circuit.

It will be understood from the foregoing description by reference to the drawings that according to this invention, there is provided on the legs of a vibrator body an electrode arrangement including electrodes for the excitation which extend from sliding ends for the length l' which is substantially one half of the length l of a said leg. And, according to this invention, however all or most of the electrodes for the excitation are preferred to have a length l' as defined above, an electrode arrangement having a few numbers of electrodes or even one electrode for the excitation extending for a half length of said leg will be also effective to the suppression of vibration modes of higher orders. However, usually, the above-noted length l' of an electrode for the excitation is preferred to be in the range of from 0.3 to 0.5 times the length l of a leg of the vibrator body so as to prevent increase in the series resonant impedance in the vibration modes of fundamental frequency. And, in the disclosure of this invention, I have mostly referred to quartz vibrators. However, it will be apparent to those skilled in the art that this invention is not limited to be adapted to such quartz vibrators, but is also effective to be adapted to use other piezoelectric materials such as lithium tantalate, lithium niobate, and piezoelectric ceramics or the like for the vibrator bodies.

I claim:

1. A tuning fork-type piezoelectric vibrator comprising:
   (i) a vibrator body having legs each with a sliding end and a free end, both as defined in the foregoing specification
   (ii) at least one excitation electrode positioned on a face of each leg, each such excitation electrode commencing at said sliding end and extending from said sliding end for a distance of from 0.3 l to 0.5 l, where l is the length of each of said legs measured from said sliding end to said free end.

2. A tuning fork-type piezoelectric vibrator, as claimed in claim 1, wherein each leg has plural faces extending in the length direction of the leg, each such face having a said excitation electrode positioned thereon.

3. A tuning fork-type piezoelectric vibrator, as claimed in claim 1, wherein each face of said legs extending in the principal faces of said vibrator body has a pair of electrodes positioned thereon, said pair of electrodes forming split electrodes for the excitation of said vibrator.

4. A tuning fork-type piezoelectric vibrator, as claimed in claim 2, wherein each said leg of the vibrator body has positioned thereon a common electrode for the cancellation of electric charges produced on portions of side faces of said leg about the nodal point of the vibration mode of the second order upon vibration of said leg, said nodal point being located at the side of the free end of said leg, said common electrode extending on said portions of the side faces of the leg and being connected to said electrodes for the excitation of the vibrator.

5. A tuning fork-type piezoelectric vibrator, as claimed in claim 3, wherein each said leg of the vibrator body is provided with a common electrode for the cancellation of electric charges produced on portions of the side faces of said leg about the nodal point of the vibration mode of second order upon vibration of said leg, said nodal point being located at the side of the free end of said leg, said common electrode extending on said portions of the side faces of the leg and being connected to a said electrode for the excitation of said vibrator.

* * * * *